(12) United States Patent
Shimada et al.

(10) Patent No.: US 12,069,809 B2
(45) Date of Patent: Aug. 20, 2024

(54) LAMINATED FILM STRUCTURE AND METHOD FOR MANUFACTURING LAMINATED FILM STRUCTURE

(71) Applicant: PANASONIC INTELLECTUAL PROPERTY MANAGEMENT CO., LTD., Osaka (JP)

(72) Inventors: Kazuya Shimada, Aichi (JP); Masahito Hayamizu, Aichi (JP); Toshihiko Sakata, Nara (JP); Makoto Chakuno, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 18/205,318

(22) Filed: Jun. 2, 2023

(65) Prior Publication Data

US 2023/0389189 A1  Nov. 30, 2023

Related U.S. Application Data

(62) Division of application No. 17/914,961, filed as application No. PCT/JP2020/048425 on Dec. 24, 2020, now Pat. No. 11,825,608.

(30) Foreign Application Priority Data

Jun. 30, 2020  (JP) ................................ 2020-112687
Dec. 14, 2020  (JP) ................................ 2020-207110

(51) Int. Cl.
C23C 28/00   (2006.01)
H05K 3/02    (2006.01)
H05K 3/42    (2006.01)

(52) U.S. Cl.
CPC .......... *H05K 3/022* (2013.01); *C23C 28/322* (2013.01); *H05K 3/422* (2013.01); *H05K 3/426* (2013.01);

(Continued)

(58) Field of Classification Search
None
See application file for complete search history.

(56) References Cited

U.S. PATENT DOCUMENTS 6,071,561 A   6/2000  Gordon et al.
8,425,978 B2  4/2013  Gessert et al.
(Continued)

FOREIGN PATENT DOCUMENTS

CN   101058873 A   10/2007
CN   106567057 A   4/2017
(Continued)

OTHER PUBLICATIONS

Deki et al., "Metal Oxide Thin Film and Higher-Order Structuring by Liquid Phase Precipitation Method", Electrochemistry, vol. 76, No. 9, 2008, pp. 678-686, translation.

(Continued)

*Primary Examiner* — Shamim Ahmed
*Assistant Examiner* — Bradford M Gates
(74) *Attorney, Agent, or Firm* — GREENBLUM & BERNSTEIN, P.L.C.

(57) ABSTRACT

Method for forming a metal film includes forming an oxide layer on a to-be-treated surface of a to-be-treated object by bringing the to-be-treated surface into contact with a reaction solution containing fluorine and an oxide precursor, removing fluorine in the oxide layer, supporting a catalyst on the oxide layer by bringing the oxide layer into contact with (Continued)

a catalyst solution, and depositing a metal film on the oxide layer by bringing the oxide layer into contact with an electroless plating liquid.

9 Claims, 5 Drawing Sheets

(52) U.S. Cl.
CPC ..... *H05K 3/427* (2013.01); *H05K 2203/0716* (2013.01); *H05K 2203/072* (2013.01); *H05K 2203/0723* (2013.01); *Y10T 428/12611* (2015.01)

(56) References Cited

U.S. PATENT DOCUMENTS

| 8,878,176 | B2 | 11/2014 | Wong et al. |
| 2002/0102775 | A1 | 8/2002 | Houng et al. |
| 2014/0026952 | A1 | 1/2014 | Kim et al. |
| 2015/0344361 | A1 | 12/2015 | Tanaka |
| 2016/0208387 | A1 | 7/2016 | Liu et al. |

FOREIGN PATENT DOCUMENTS

| CN | 109 790 622 A | 5/2019 | |
| EP | 0 708 581 A2 | 4/1996 | |
| JP | H05-331660 A | 12/1993 | |
| JP | H07-309638 A | 11/1995 | |
| JP | 2002-047589 A | 2/2002 | |
| JP | 2002-299338 A | 10/2002 | |
| JP | 2005-289767 A | 10/2005 | |
| JP | 2006-041062 A | 2/2006 | |
| JP | 4508680 B2 | 7/2010 | |
| JP | 2016-533429 A | 10/2016 | |
| TW | 478062 B | 3/2002 | |
| WO | WO-9701599 A1 * | 1/1997 | ........... C03C 17/009 |

OTHER PUBLICATIONS

Nasuno et al., "Development of Metallization Technology Using Titanium Dioxide Thin Film", Toyama Industrial Technology Center, No. 25, 2011, pp. 45-46 translation.
Office Action issued in CN Patent Application No. 202080033079.1, Mar. 31, 2022, translation.
Reasons for Refusal issued in JP Patent Application No. 2020-207110, Jun. 8, 2021, translation.
Decision to Grant issued in JP Patent Application No. 2020-207110, Jun. 8, 2021, translation.
ISR issued in International Patent Application No. PCT/JP2020/048425, Feb. 22, 2021, translation.
Office Action issued in CN Patent Application No. 202080033079.1, Jan. 30, 2023, X/Y/A chart showing degree of relevance.
Decision to Grant issued in JP Patent Application No. 2020-207110, Jun. 29, 2021, translation.
Partial European Search Report issued in EP Patent Application No. 23203157.5, Feb. 6, 2024.
EESR issued in EP Patent Application No. 23203157.5, Jun. 5, 2024.

* cited by examiner

[Fig. 1]
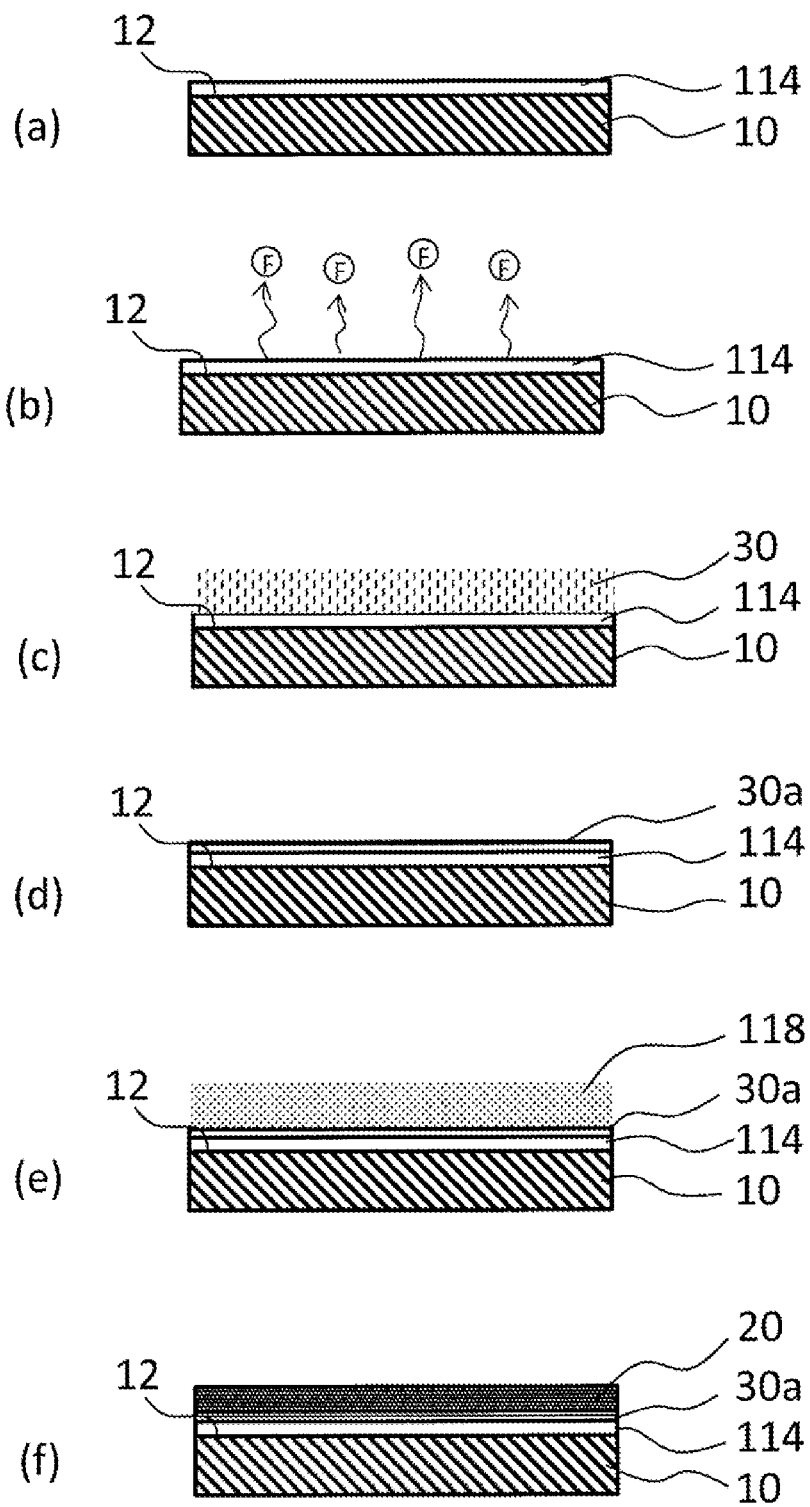

[Fig. 2]
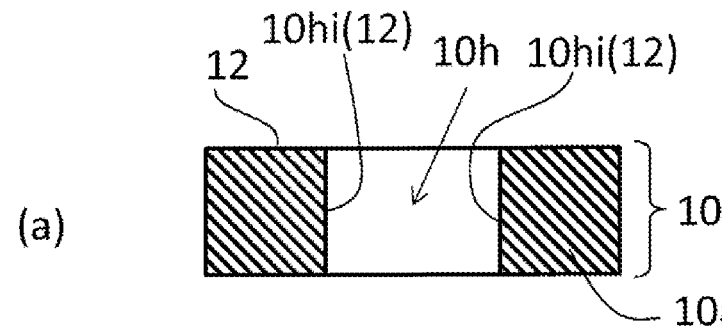
(a)
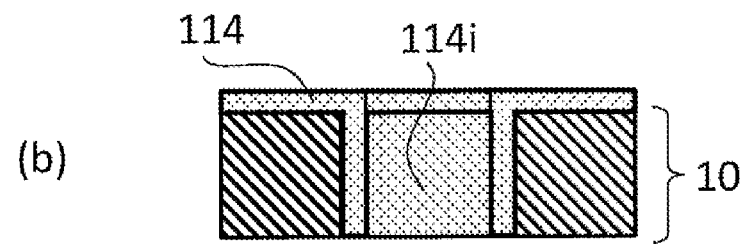
(b)
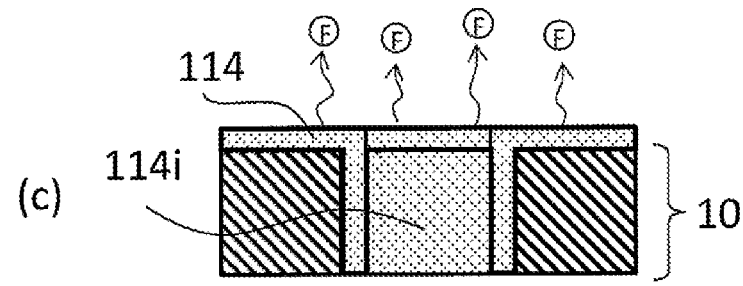
(c)
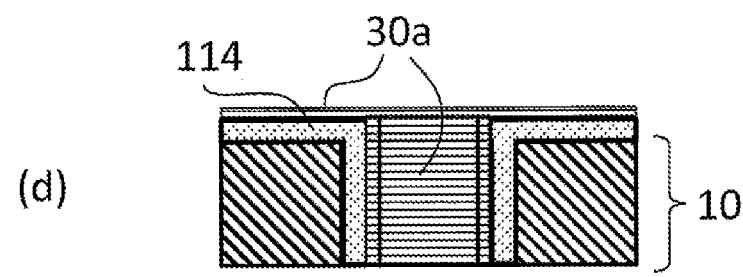
(d)
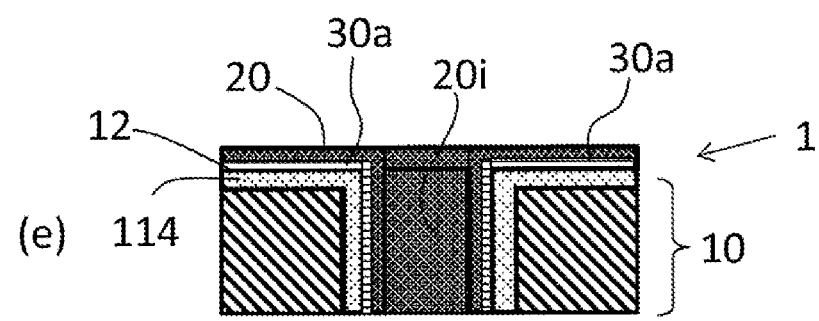
(e)

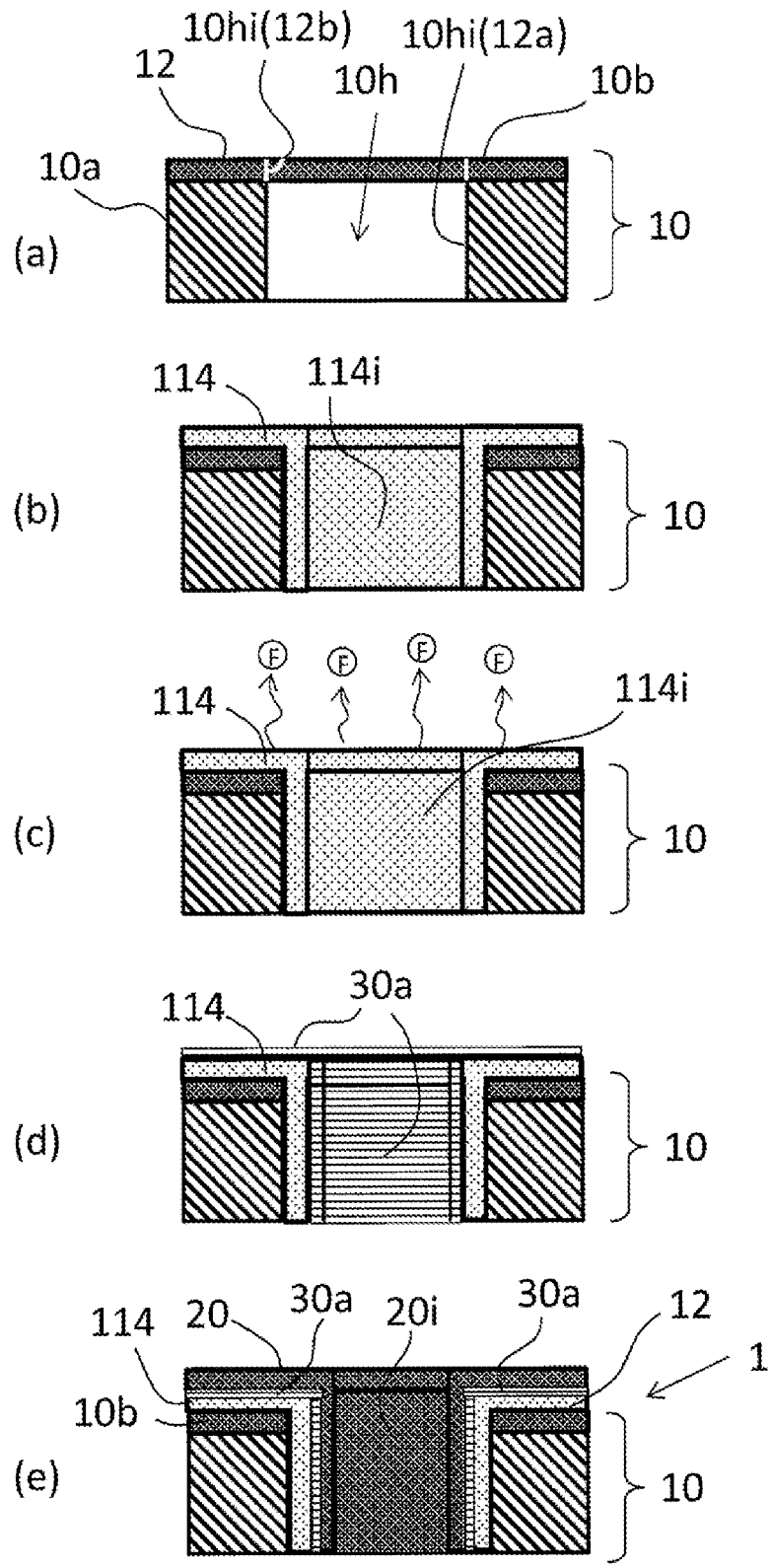
[Fig. 3]

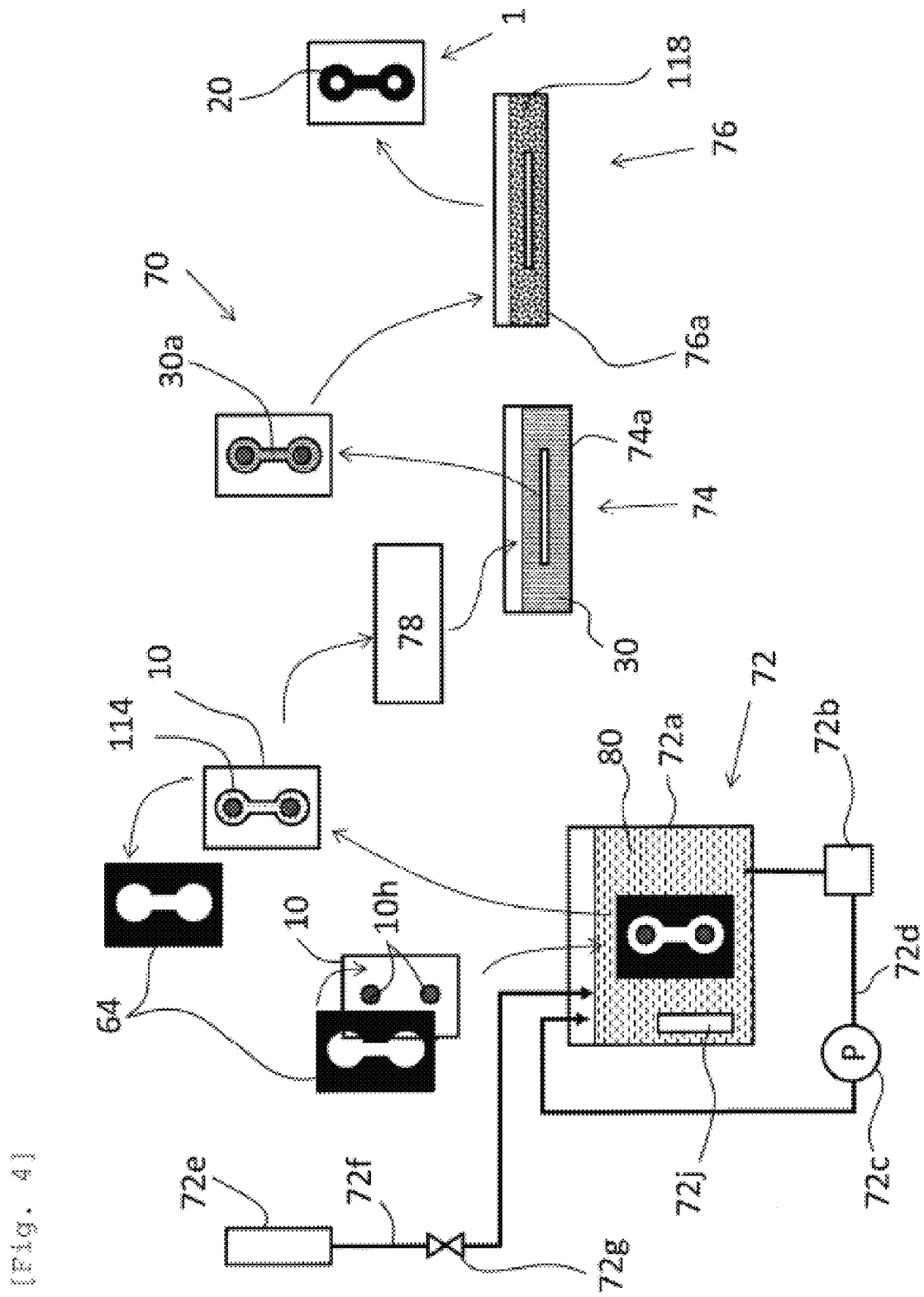
[Fig. 4]

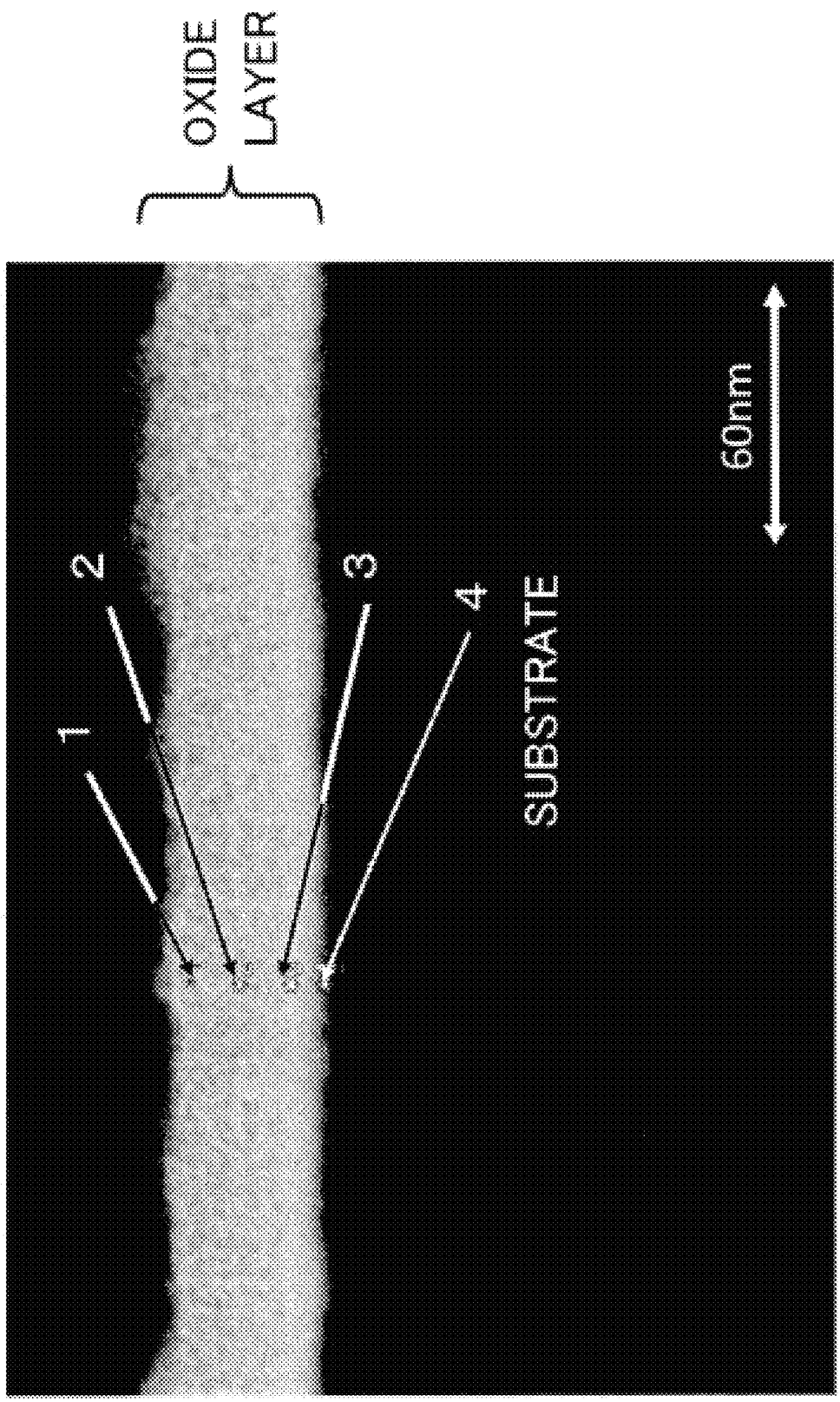

LAMINATED FILM STRUCTURE AND METHOD FOR MANUFACTURING LAMINATED FILM STRUCTURE

This application is a Divisional of U.S. patent application Ser. No. 17/914,961, filed Sep. 27, 2022, which is a National Stage Entry of International Patent Application No PCT/JP2020/048425 filed Dec. 24, 2020, and which claims the benefit of Japanese Patent Application No. 2020-112687, filed Jun. 30, 2020 and Japanese Patent Application No. 2020-207110, filed Dec. 14, 2020. The disclosure of each of the applications listed above is incorporated by reference herein in its entirety.

FIELD

The present invention relates to a laminated film structure having a metal film formed on an insulating substrate such as a resin substrate, a ceramic substrate, a glass substrate, a quartz substrate, or a silicon substrate, or on metal such as copper, aluminum, or silver; a method for manufacturing the laminated film structure; an apparatus for forming the laminated film structure; and electronic products using the laminated film structure.

BACKGROUND

A plating method has conventionally been adopted for forming a metal film on a to-be-treated object. In this method, a metal film is first formed on the surface of the to-be-treated object by electroless plating. Then the thickness of the metal film is increased by electrolytic plating.

In the case of performing electroless plating, in order to ensure adhesion of a metal film, it is necessary to perform a roughening treatment in advance to impart fine unevenness to the surface of a to-be-treated object by means such as wet etching, and then support a catalytic metal such as palladium on the surface of the to-be-treated object. Then, the catalytic metal supported on the surface of the to-be-treated object serves as a core, on which the metal film is formed by electroless plating.

Meanwhile, a method has been known as a technology for forming a metal film without application of roughening treatment to a to-be-treated object. In this method, an oxide layer is formed on the surface of a to-be-treated object, and a metal film is formed on the oxide layer by plating or the like.

As the methods for forming the oxide layer, a method in which the surface of a to-be-treated object is modified with a silane coupling agent, and then, an oxide colloidal solution is applied to the surface of the to-be-treated object, or the surface of the to-be-treated object is immersed in the oxide colloidal solution (Patent Literature 1); a method using a sputtering method (Non-Patent Literature 1); and a method in which the surface of a to-be-treated object is brought into contact with an aqueous solution containing metal ions so as to deposit an oxide layer on the to-be-treated surface (Patent Literature 2) are known.

The method for depositing the oxide on the to-be-treated surface is attracting attention as a method for forming a metal film on the surface of glass, resin, ceramics, quartz, silicon or the like. The method is also advantageous in that roughening for ensuring adhesion of the metal film to the to-be-treated surface is not necessary.

As in Patent Literature 1 and Non-Patent Literature 1, formation of the oxide layer on the to-be-treated surface by the methods involving the colloidal solution or sputtering is possible in the case where the to-be-treated surface is flat. However, it is not easy to form the oxide layer on inner wall surfaces of through holes. This causes a problem of uneven formation of the metal film. Moreover, as in Patent Literature 2, in the method involving bringing a to-be-treated surface into contact with an aqueous solution containing metal ions to deposit the oxide layer on the to-be-treated surface, the aqueous solution contains an organic solvent, which causes problems where deposition operation is complicated and uniform deposition is difficult.

A liquid phase deposition method (hereinafter also referred to as "LPD method") involving fluorine is known to form a stable oxide layer. By making an oxide layer formed by the LPD method to support a catalyst and then forming a metal film by an electroless plating method, the above-described problems included in the methods in Patent Literatures 1 and 2, and Non-Patent Literature 1 can be solved.

CITATION LIST

Patent Literature

Patent Literature 1: Japanese Patent No. 4508680
Patent Literature 2: Japanese Translation of PCT Patent Application Publication No. 2016-533429

Non-Patent Literature

Non-Patent Literature 1: Report of the Toyama Industrial Technology Center, NO. 25 (2011)

SUMMARY

Technical Problem

However, it has been found that when the oxide layer is formed on the to-be-treated surface by the LPD method and the metal film is then formed by plating, unevenness or very small bulging portions are generated on the final metal film under certain conditions.

Solution to Problem

As a result of extensive studies, the inventors of the present invention have found that when an oxide layer is formed by the LPD method; a catalyst is supported on the oxide layer; and a metal film is then formed by an electroless plating method, unevenness, very small bulges, cracks, or separation occur due to fluorine remaining on the to-be-treated surface. Based on the finding, the inventors conceived the present invention. Specifically, the present invention provides a laminated film structure and a method for manufacturing the laminated film structure as a solution to the problems stated above.

Specifically, the laminated film structure according to the present invention includes:
  a to-be-treated object, the to-be-treated object being made of an insulator or an insulator having a conductive layer formed on a surface thereof in advance,
  an oxide layer formed on the surface of the to-be-treated object,
  a catalyst layer provided on the oxide layer, and
  a metal layer provided on the catalyst layer, wherein the fluorine content of the oxide layer is 0.01% by mass or more and 0.1% by mass or less.

The method for manufacturing a laminated film structure according to the present invention includes:

a first film forming step of forming an oxide layer on a to-be-treated surface of a to-be-treated object by bringing the to-be-treated surface into contact with a reaction solution containing fluorine and an oxide precursor, the to-be-treated object being made of an insulator or an insulator having a conductive layer formed on the surface thereof in advance;

a fluorine removal step of removing fluorine in the oxide layer;

a catalyst supporting step of forming a catalyst layer by bringing the oxide layer into contact with a catalyst liquid; and a second film forming step of forming a metal film on the catalyst layer by an electroless plating method.

It should be noted that, for the laminated film structure according to the present invention, an oxide layer obtained by removing fluorine before forming a metal film is also included. Specifically, the laminated film structure according to the present invention includes:

a to-be-treated object, the to-be-treated object being made of an insulator or an insulator having a conductive layer formed on a surface thereof in advance; and an oxide layer formed on a surface of the insulator, wherein the fluorine content of the oxide layer is 0.01% by mass or more and 0.1% by mass or less.

In addition, an oxide layer from which fluorine is removed is also included in the manufacturing method as well. Specifically, the method for manufacturing a laminated film structure according to the present invention includes:

a first film forming step of forming an oxide layer on a to-be-treated surface of a to-be-treated object by bringing the to-be-treated surface into contact with a reaction solution containing fluorine and an oxide precursor, the to-be-treated object being made of an insulator or an insulator having a conductive layer formed on the surface thereof in advance; and a fluorine removal step of removing fluorine in the oxide layer.

Advantageous Effects of Invention

In the present invention, since a reaction solution containing fluorine and an oxide precursor is brought into contact with a to-be-treated object to form an oxide layer on the to-be-treated surface, the resulting oxide layer is formed on the to-be-treated surface of the to-be-treated object by chemical bonding, so that the oxide layer is hardly separated even without a sintering step.

In the present invention, a step of removing fluorine remaining in the oxide layer after the oxide layer is formed is added. This makes it possible to avoid adverse effects, caused by emission of fluorine remaining in the oxide layer, on the metal film or the like deposited in a later step. Therefore, stable formation of the metal film is achieved.

The oxide layer has a higher property of supporting the catalyst than the to-be-treated surface itself. As a result, the metal film obtained by electroless plating is also hardly separated from the to-be-treated surface.

Since the reaction solution contains fluorine, the oxide precursor in a fully ionized state is brought into contact with the to-be-treated surface. Therefore, the ions can be distributed even to narrow sections such as through holes. As a result, the oxide layer can be formed uniformly on the to-be-treated surface of the to-be-treated object including the through holes, which makes it possible to uniformly fabricate the metal film by electroless plating.

The oxide layer formed in the present invention has higher catalyst adsorption and diffusion properties than the to-be-treated surface itself. Therefore, the oxide layer can support the catalyst at a higher density, which results in high adhesion between the metal film and the oxide layer.

Further, the oxide layer formed in the present invention is directly formed on the to-be-treated surface of the to-be-treated object without intervention of any coupling agent. Therefore, an annealing step for removing stress and improving adhesion of the metal film can be carried out without considering decomposition of the coupling agent.

Moreover, the metal film formed in the present invention is made to adhere to the to-be-treated object through the oxide layer, and will not separate without roughening the to-be-treated surface of the to-be-treated object. Therefore, the present invention can provide a smooth metal film, and such a metal film has a small loss by a skin effect. Even when the metal film is used in high-frequency bands, which are used in Generation Mobile Communication System (5G), onboard millimeter-wave radar antennas, and interfaces such as MHL3.0 and Thunderbolt used in high-speed transmission, the metal film does not cause transmission loss.

In addition, the process of modifying the to-be-treated surface of the to-be-treated object in advance with a silane coupling agent becomes unnecessary, and thus the oxide layer can be formed more easily.

BRIEF DESCRIPTION OF DRAWINGS

FIGS. 1(a)-1(f) include diagrams for illustrating the principle of a method for forming a metal film according to the present invention.

FIGS. 2(a)-2(e) include diagrams for illustrating a step of forming the metal film according to the present invention in the case where a to-be-treated object is only an insulating substrate.

FIGS. 3(a)-3(e) include diagrams for illustrating the step of forming the metal film according to the present invention in the case where the to-be-treated object is the insulating substrate having a metal layer formed thereon in advance.

FIG. 4 is a diagram for illustrating an apparatus for forming the metal film according to the present invention.

FIG. 5 is a photograph showing points for measuring a fluorine content in an oxide layer.

DESCRIPTION OF EMBODIMENTS

Hereinafter, a method for forming a laminated film structure according to the present invention will be described by showing an embodiment. The following description is an illustrative example of the embodiment of the present invention and is not intended to limit the scope of the present invention. The following description may be modified without departing from the spirit of the present invention. In the following description, "above" refers to the direction away from a to-be-treated surface serving as a reference, and "below" refers to the direction closer to the to-be-treated surface. In addition, in the following description, "directly on" and "directly below" refer to the configuration where no other layers are interposed between two objects. The laminated film structure according to the present invention includes those having only one oxide layer formed on a to-be-treated object having a to-be-treated surface. In other words, only one layer may be laminated on the to-be-treated surface A method for forming a laminated film structure in the present invention includes:

a first film forming step of forming an oxide layer on a to-be-treated surface of a to-be-treated object by bringing the to-be-treated surface into contact with a reaction solution containing fluorine and an oxide precursor;

a fluorine removal step of removing fluorine in the oxide layer;

a catalyst supporting step of supporting a catalyst on the oxide layer by bringing the oxide layer into contact with a catalyst solution; and a second film forming step of depositing a metal film on the oxide layer by bringing the oxide layer into contact with an electroless plating liquid. Hereinafter, the principle of the method for forming a metal film according to the present invention will be described.

FIG. 1 shows a method for forming a laminated film structure according to the present invention. With reference to FIG. 1(a), in the first film forming step, a to-be-treated surface 12 of a to-be-treated object 10 comes into contact with a reaction solution containing fluorine and oxide precursor ions. Note that the to-be-treated surface 12 is cleaned by a method such as chemical washing, UV irradiation, and plasma irradiation before treatment.

As a result, due to reactions described later, oxides of the oxide precursor ions are deposited, so that an oxide layer 114 is formed on the to-be-treated surface 12 (FIG. 1(a)). Then, contact between the to-be-treated surface 12 and the reaction solution is stopped, and the to-be-treated surface 12 is washed with water to remove the reaction solution. Washing with water does not damage the oxide layer 114.

Next, the fluorine removal step is performed to remove the residual fluorine in the oxide layer 114 (FIG. 1(b)). As described above, in the present invention, the oxide layer 114 is formed by using a reaction solution containing fluorine in a liquid phase. Therefore, the generated oxide layer 114 contains fluorine. Removing the fluorine can avoid damages to a metal film 20 which is laminated later. As a method for removing fluorine, an annealing treatment and a chemical treatment with an alkali solution can be used. These methods may suitably be used depending on the film type and the film thickness of the oxide layer 114.

A description will now be given of the catalyst supporting step. The to-be-treated object 10 having the oxide layer 114, after the fluorine removal treatment, formed on the to-be-treated surface 12 is brought into contact with a catalyst solution 30 (FIG. 1(c)). A catalyst 30a in the catalyst solution 30 is supported on the surface of the oxide layer 114, or is supported on the oxide layer 114 by being diffused into the inside of the oxide layer 114. Then, contact between the to-be-treated surface 12 and the catalyst solution is stopped, and the to-be-treated surface 12 is washed with water to remove the catalyst solution 30. Washing by water does not damage the catalyst 30a on the oxide layer 114 (FIG. 1(d)).

A description will now be given of the second film forming step. When the oxide layer 114 supporting the catalyst is brought into contact with an electroless plating liquid 118 (FIG. 1(e)), the metal film 20 is formed on the oxide layer 114 (FIG. 1(f)).

Thus, with use of the reaction solution containing fluorine and oxide precursor ions to form the oxide layer 114, the oxide layer 114 on the to-be-treated surface 12 of the to-be-treated object 10 is bound in the state of having a chemical bond. Therefore, even without sintering, a very strongly affixed layer can be formed, and the metal film 20 formed on top of the layer also has very high adhesion to the to-be-treated object 10.

After the metal film 20 is formed, the thickness of the metal film 20 may be further increased by electrolytic plating. In such a case, since the metal film 20 has already been formed, the surface of the to-be-treated object 10 is electrically conductive, which makes it possible to facilitate electrolytic plating.

Here, appropriate heat treatment may be added to before or after the first film forming step, the fluorine removal step, the catalyst supporting step, the second film forming step, or the electrolytic plating. This is because that in the present invention, a residual fluorine content in the oxide layer 114 is reduced to a fixed amount or less. When the heat treatment is performed, the residual fluorine does not push up the metal film 20 or the like, which is located on the uppermost surface. This prevents the generation of damages such as unevenness, very small bulges, separation, and cracks on the metal film 20.

Note that products fabricated by using the method for forming laminated film structure according to the present invention are called as electronic products 1. The electronic products 1 include not only electronic-related products such as circuit boards, semiconductor circuits, and electronic components, but also films using the metal film 20 according to the present invention, used as protective films and finishing films for decoration. Hereinafter, the contents of the present invention will be described in detail.

<To-be-Treated Object>

As the to-be-treated object 10, an insulating substrate or an insulating substrate having a conductive layer formed on the surface thereof in advance may be mentioned. Examples of the insulating substrates include a resin substrate, a ceramic substrate, a glass substrate, and a silicon substrate, which are used as a circuit board for use in various electronic devices.

As the resin substrate, those made of a polyimide resin, a methacrylic resin, an epoxy resin, a liquid crystal polymer, a polycarbonate resin, or a fluorine-based resin such as a PFA, a PTFE, or an ETFE as a raw material can be suitably used. In addition, the resin substrate may contain glass fibers for improving mechanical strength.

As the ceramic substrate, those made of aluminum oxide such as alumina or sapphire, aluminum nitride, silicon nitride, silicon carbide, zirconium oxide, yttrium oxide, titanium nitride, or barium titanate as a raw material can be suitably used.

The glass substrate is an amorphous substrate made of a silica network, and may contain a network former (network-forming oxide) of aluminum, boron, phosphorus or the like, and a network modifier (network-modifying oxide) of an alkali metal, an alkaline earth metal, magnesium or the like.

A quartz substrate is a wafer made of synthetic quartz. The silicon substrate is a wafer made of a single crystalline silicon or polycrystalline silicon.

The conductive layer formed in advance on the insulating substrate is mainly used as a circuit pattern, and is not only of a highly conductive metal such as aluminum, copper, or silver formed by wet etching, dry etching or the like on the insulating substrate, but may also be of a conductive transparent material such as ITO (indium titanium oxide), FTO (fluorine-containing tin oxide), or ATO (antimony-containing oxide). The shape of the to-be-treated object may include a wafer, a panel, and a film. In its surface, through holes, blind vias (non-through holes), deformed surfaces such as trenches (grooves) and the like may be formed.

FIG. 2 and FIG. 3 schematically show a process of forming a metal film according to the present invention in a case where the to-be-treated object 10 is an insulating substrate. FIG. 2 shows a case where the to-be-treated object 10 is only an insulating substrate 10a, and FIG. 3 shows a case where the to-be-treated object 10 has a conductive layer 10b formed in advance on the insulating substrate 10a. The drawings each show a cross section including a through hole 10h.

With reference to FIG. 2(a) and FIG. 3(a), it is preferable that these objects to be treated 10 be subjected to a treatment of cleaning the to-be-treated surface 12 as a pretreatment of the first film forming step of forming the oxide layer 114. For example, it is preferable to perform an acid treatment, an alkali treatment, an ultraviolet irradiation treatment, an electron beam (ion beam) irradiation treatment, a plasma treatment or the like.

The to-be-treated surface 12 of the to-be-treated object refers to a surface on which the metal film 20 is finally formed. The to-be-treated surface 12 includes not only the surface of the to-be-treated object 10 but also the inner wall of the through hole 10h when the to-be-treated object 10 has the through hole 10h. In the present invention, since the oxide layer 114 is formed in a liquid phase, the oxide layer 114 can also be formed even on the inner wall 10hi of the through hole 10h.

Note that a portion where the metal film 20 is not formed is the surface of the to-be-treated object 10, but is not the to-be-treated surface 12. In FIG. 1, the back surface (lower side in the drawing) of the to-be-treated object 10 is not the to-be-treated surface 12. Such a surface can be masked in advance so that the oxide layer 114 is prevented from being formed thereon.

Furthermore, when the to-be-treated object 10 includes the conductive layer 10b formed on the surface of the insulating substrate 10a (FIG. 3(a)), the to-be-treated surface 12 is the surface of the conductive layer 10b. Furthermore, when the through hole 10h is formed in the insulating substrate 10a in which the conductive layer 10b is formed on the surface thereof, the inner wall 10hi of the through hole 10h also becomes the to-be-treated surface 12. In this case, the inner wall 10hi of the through hole 10h includes a cross-sectional portion 12b of the conductive layer at the surface and a cross-sectional portion 12a of the insulating substrate 10a following the cross-sectional portion 12b. Therefore, the to-be-treated surface 12 may be a surface of an insulator, or the surface of a conductive material.

<First Film Forming Step>

The first film forming step of forming the oxide layer 114 includes bringing the to-be-treated surface 12 of the to-be-treated object 10 into contact with the reaction solution containing fluorine and oxide precursor ions. More specifically, it is possible to suitably use a method in which the to-be-treated object 10 is immersed in an aqueous tank filled with the reaction solution containing at least one ion selected from the group consisting of titanium, silicon, tin, zirconium, zinc, nickel, indium, vanadium, chromium, manganese, iron, cobalt, and copper, or sprayed or applied with the reaction solution.

The oxide layer 114 is formed directly on the to-be-treated surface, but it can be said that the oxide layer 114 is formed on the surface of the insulator. That is, the conductive layer 10b may be included between the surface of the insulator and the oxide layer 114. In other words, the to-be-treated surface may be an insulator or a conductive layer.

FIG. 2(b) and FIG. 3(b) show a state in which the oxide layer 114 is formed. Since the oxide layer 114 is formed in a liquid phase, the oxide layer 114 is also formed on the inner wall 10hi of the through hole 10h. In FIG. 2(b) and FIG. 3(b), the oxide layer 114 formed on the inner wall 10hi of the through hole 10h is indicated by reference numeral "114i". Since the oxide layer 114 is formed in a liquid phase, a dense continuous film is formed. Here, the "continuous film" means a state in which no gap is formed between the formed film and the to-be-treated surface 12, and there is no portion (so-called "film omission") where the film is not formed over the entire to-be-treated surface 12.

Since the oxide layer 114 is formed in a liquid phase, the oxide layer 114 is uniformly formed on the inner walls of the through hole and the blind via.

The reaction solution may be composed of an aqueous solution containing fluorine and an oxide precursor ion such as titanium, silicon, tin, zirconium, zinc, nickel, indium, vanadium, chromium, manganese, iron, cobalt, and copper.

The oxide precursor ion may be present in the form of $M^{n+}$ (M: precursor element, n: valency of ion) and can be obtained by dissolving a fluoride or an oxide of a precursor element in hydrofluoric acid. Furthermore, such a fluoride may be added separately. Examples of the fluoride include a sodium salt, a potassium salt, a magnesium salt, a calcium salt, and an ammonium salt.

The oxide precursor ion may also be present in the form of a fluoro complex (for example, $MF_6^{2-}$ *M: a precursor element), or may be $H_2MF_6$, or in the form of a sodium salt, a potassium salt, a magnesium salt, a calcium salt, or an ammonium salt. Since the reaction solution contains fluorine, there is a possibility of dissolving (etching) the to-be-treated surface of the to-be-treated object such as a ceramic substrate or a glass substrate. Thus, the pH may be controlled to prevent etching.

The contact temperature of the to-be-treated object 10 with the reaction solution is favorably higher, preferably 20 to 80° C., and more preferably 30 to 70° C. The reaction time is determined on the basis of the required film thickness of the oxide layer 114. The reaction time and the film thickness have a generally linear relationship, and a film thickness of several nm to several tens of μm can be obtained by adjusting the reaction time.

The composition of the reaction solution preferably contains the precursor element in an amount of 1 mmol/L or greater, and fluorine in an amount that can completely dissolve the precursor element.

Furthermore, when the reaction solution contains an additive such as a boric acid salt, an aluminum salt, or hydrogen peroxide, the film forming rate of the oxide layer 114 can be improved. Therefore, an element of boron or aluminum may be contained in the oxide layer 114. This mechanism will be described with reference to an exemplary case where a hexafluorotitanate ion ($TiF_6^{2-}$) is used as the oxide precursor.

When a hexafluorotitanate ion ($TiF_6^{2-}$) is used, a film of $TiO_2$ can be formed on the to-be-treated surface, by the following reaction as the oxide layer 114.

[Chemical Formula 1]

$$TiF_6^{2-}+2H_2O=TiO_2+6F^-+4H^+ \qquad (1)$$

This reaction is a hydrolysis reaction of $TiF_6^{2-}$ and is accelerated by adding an additives such as a boric acid salt, an aluminum salt, or hydrogen peroxide.

For example, when boric acid is added, $F^-$ on the right side of Formula (1) is reacted by the reaction of Formula (2) to form $BF_4^-$. As a result, the reaction of Formula (1) proceeds to the right side, and it is possible to accelerate the formation of titanium oxide onto the to-be-treated surface of the to-be-treated object. The reaction initiator is not limited to boric acid, and may be a salt such as sodium borate, ammonium borate, or potassium borate.

[Chemical Formula 2]

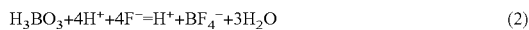

$$H_3BO_3 + 4H^+ + 4F^- = H^+ + BF_4^- + 3H_2O \quad (2)$$

Similarly, when an aluminum-ion source is added as a reaction initiator, $AlF_6^{3-}$ is generated by the reaction of Formula (3), so that the reaction of Formula (1) proceeds to the right side. As a result, it is possible to accelerate the formation of titanium oxide on the to-be-treated surface of the to-be-treated object. In addition to metal aluminum, an inorganic acid salt such as aluminum chloride, aluminum nitrate, or aluminum sulfate, or an organic acid salt such as aluminum citrate, aluminum lactate, or aluminum acetate can be suitably used as the aluminum ion source.

[Chemical Formula 3]

$$Al^{3+} + 6F^- = AlF_6^{3-} \quad (3)$$

Furthermore, although there is no complexing ability with a fluorine ion, hydrogen peroxide can also be suitably utilized as a reaction initiator. Hydrogen peroxide has the property of hydrolyzing a fluorotitanate ion. As a result, titanium peroxo complexes are produced. This is a precursor of titanium oxide, and can be brought into contact with the to-be-treated surface of the to-be-treated object in this state. As a result, it is possible to deposit titanium oxide on the to-be-treated surface of the to-be-treated object, and to promote the formation of the oxide layer.

During the reaction, the oxide layer 114 is formed on the to-be-treated surface 12 of the to-be-treated object 10, and may be generated as particles in the reaction solution in some cases. In this case, in order to remove particles in the reaction solution, a step of removing a part of the reaction solution, filtering it through a filter, and then returning it to the system may be performed. This is called a filtering step.

<Fluorine Removal Step>

In the oxide layer 114 formed in FIG. 2(c) and FIG. 3(c), fluorine remains. This residual fluorine does not disappear or volatilize even by washing with water or standing still. On the other hand, when the metal film 20 is laminated on the oxide layer 114 in the subsequent step, the residual fluorine is detached from the oxide layer 114 by chemical treatment at the time of lamination, heat treatment after lamination or the like, and gives damage to the metal film 20. Therefore, after forming the oxide layer 114, a fluorine removal step is performed.

In the laminated film structure obtained by the method for forming a laminated film structure of the present invention, the fluorine content in the oxide layer 114 is by mass or more and 1.0% by mass or less. The smaller the amount of residual fluorine in the oxide layer 114, the better. The amount of residual fluorine may be zero % by mass. However, it is difficult to make the residual fluorine in the oxide layer 114, formed by a treatment using a reaction solution containing fluorine in liquid, zero. Therefore, the content of fluorine may be equal to or lower than a detection limit of a detection device. For example, the content is 0.01% by mass.

On the other hand, if fluorine in the oxide layer 114 exceeds 1.0% by mass, when the metal film 20 is laminated or a subsequent change in time occurs, fluorine is detached from the oxide layer 114 and the metal film 20 is lifted, thereby causing damage such as unevenness, micro-bulging, cracking, and peeling. Furthermore, the supported amount of the catalyst for electroless plating is reduced, and the metal film in electroless plating is less likely to grow.

As clearly shown in examples described later, specific preferable fluorine removal steps differ in accordance with the film thickness of the oxide layer 114 and the metal type used in the oxide layer. When the film thickness of the oxide layer 114 is 200 nm or more, fluorine in the oxide layer 114 can be removed, by using both an annealing treatment at 100° C. to 150° C. and an alkali solution treatment with a solution having a pH of 10.5 or higher, regardless of the metal type.

Furthermore, when the film thickness is less than 200 nm and the metal type of the oxide layer 114 is one which forms an amphoteric oxide such as Sn (tin), Al (aluminum), Zn (zinc), Be (beryllium), Ga (gallium), Ge (germanium), Pb (lead), Sb (antimony), Bi (bismuth), and Cd (cadmium), fluorine in the oxide layer 114 can be removed by a combination of an annealing treatment at 100° C. to 150° C. and an alkali solution treatment with a solution with a pH of 10.5 or higher, or by an annealing treatment at 150° C. or higher.

In addition, when the film thickness is less than 200 nm and the metal type of the oxide layer 114 is not an amphoteric oxide, fluorine in the oxide layer 114 can be removed by an annealing treatment at 150° C. or higher or an alkali solution treatment with a pH of 10.5 or higher.

<Catalyst Supporting Step>

In the catalyst supporting step, it is preferable to give a catalyst 30a, by which electroless plating at a subsequent stage is activated, to the oxide layer 114 and to cause the oxide layer 114 to support the catalyst. In other words, the catalyst solution 30 is a solution containing ions such as gold, palladium, or silver. Supporting of the catalyst is achieved by bringing them into contact with the to-be-treated object 10 which has the oxide layer 114 formed thereon. In doing so, a method in which the to-be-treated object 10, which has the oxide layer 114, is immersed in an aqueous tank filled with the catalyst solution 30 or sprayed or applied with the same can be suitably utilized. FIG. 2(d) and FIG. 3(d) show a state in which the catalyst 30a is supported on the oxide layer 114. The supported catalyst 30a may be referred to as a catalyst layer. That is, the catalyst layer is formed directly on the oxide layer 114.

Supporting the catalyst 30a on the oxide layer 114 is achieved due to surface adsorption and diffusion into the oxide layer 114, and the catalyst 30a is usually supported in an ionic state. This is reduced to a metal by a reducing agent contained in the plating liquid in the electroless plating step of the subsequent stage, and acts as a catalyst core, so that the plating is activated.

If it is desired to metallize the catalyst 30a in advance prior to the electroless plating step, it is achieved by exposing the oxide layer 114 to a solution containing a divalent tin ion (Sn 2+), prior to the catalyst supporting step to support $Sn^{2+}$ and sensitize the oxide layer 114, and exposing the oxide layer 114 to the catalyst solution 30. Alternatively, it is also achieved by exposing the oxide layer 114 to a reducing agent before electroless plating after exposing the oxide layer 114 to the catalyst solution 30.

Here, when SnO is formed as the oxide layer 114, $Sn^{2+}$ is abundantly present in the layer, and functions as a reducing agent, so that the oxide layer 114 can support the catalyst in a metallic form in the catalyst supporting step.

<Second Film Forming Step>

In the second film forming step, the metal film 20 is formed using a commercially available electroless plating liquid 118. FIG. 2(e) and FIG. 3(e) show a state in which the metal film 20 is formed directly on the catalyst 30a. At this time, the electroless plating method is activated while the catalyst 30a supported in the catalyst supporting step serves as a nucleus. For example, when copper is selected as the metal film 20, a plating liquid using formaldehyde as a reducing agent in addition to copper sulfate is used. When phosphorus-containing nickel is selected as the metal film 20, a plating liquid using phosphinic acid as a reducing agent in addition to nickel sulfate is used. The electroless plating liquid 118 is selected in accordance with its desired metal type, internal stress, and film forming rate, but is prepared in consideration of the pH value of the plating liquid and the solubility of the oxide layer 114.

<Film Thickness Increasing Step by Electrolytic Plating>

The thickness of the metal film 20 obtained in the second film forming step may be increased by electrolytic plating. In this case, a metal of the same type as that of the metal film 20 obtained in the second film forming step may be adopted for increasing its thickness, but a different type metal may be adopted. The electrolytic plating liquid may be a commercially available chemical, but is selected in consideration with its desired metal type, internal stress, and film forming rate, so that appropriate current density (ASD value) is set.

<Manufacturing Apparatus>

A description will now be given of an apparatus 70 for forming a laminated film structure according to the present embodiment with reference to FIG. 4. The apparatus 70 for forming a laminated film structure is constituted of a first film forming part 72, a fluorine removing part 78, a catalyst supporting part 74, and a second film forming part 76. Although not shown, a plating device that further plates the finished electronic products 1 may also be included in the apparatus 70.

The first film forming part 72 forms the oxide layer 114 on the to-be-treated surface 12 of the to-be-treated object 10 in a liquid phase. Here, the to-be-treated object 10 will be described as a type to be immersed in the reaction solution 80 containing fluorine and oxide precursor ions.

The first film forming part 72 has a first tank 72a, which stores the reaction solution 80 containing fluorine and oxide precursor ions. The first tank 72a may be provided with a circulation pipeline 72d via a filter 72b, and a pump 72c arranged in the circulation pipeline 72d. In addition, a heater 72j may be provided in the first tank 72a.

The first tank 72a may also be provided with a reaction initiator tank 72e which stores a reaction initiator, a pipeline 72f which introduces the reaction initiator to the first tank 72a, and a valve 72g which controls the injection of the reaction initiator into the first tank 72a.

As the fluorine removing part 78, equipment such as an annealing furnace and an alkali solution treatment tank may appropriately be selected depending on the thickness of the oxide layer 114 and the metal type as described above.

The catalyst supporting part 74 immerses the to-be-treated object 10, provided with the oxide layer 114, in the catalyst solution 30 containing ions such as palladium and silver ions, which can be used as a catalyst for electroless plating. The catalyst solution 30 is stored in a catalyst solution tank 74a. An electroless plating part 76 stores the electroless plating liquid 118 in a plating tank 76a.

Next, the operation of the apparatus 70 for forming a laminated film structure will be described alongside a treatment flow of the to-be-treated object 10. It is supposed that the to-be-treated object 10 is an insulating substrate having through holes 10h. Here, it is supposed that the insulating substrate has two through holes 10h. The to-be-treated object 10 is fitted with a mask 64. The mask 64 is designed to expose only the surface or surfaces to be treated 12 of the to-be-treated object 10. Here, it is supposed that inner walls and peripheries of the through holes 10h and a connection line which links the through holes 10h are the surfaces to be treated 12. In FIG. 4, the mask for only the front side of the to-be-treated object 10 is shown. However, the back side of the to-be-treated object 10 may be masked.

The to-be-treated object 10 fitted with the mask 64 is immersed in the first tank 72a, which stores the reaction solution 80 containing fluorine and oxide precursor ions. Then, the reaction initiator is introduced from the reaction initiator tank 72e into the first tank 72a via the pipeline 72f. This results in formation of the oxide layer 114 on the to-be-treated surface 12. Note that the oxide layer 114 can be formed without use of the reaction initiator when the first tank 72a is heated in advance with the heater 72j to increase the temperature of the reaction solution 80 containing fluorine and the oxide precursor ions.

In the case where oxide fine particles are deposited and suspended in the reaction solution 80 containing fluorine and oxide precursor ions in the first tank 72a, the pump 72c is operated so that the reaction solution 80 containing fluorine and oxide precursor ions is circulated and filtered in the circulation pipeline 72d via the filter 72b. Through this circulation, the oxide fine particles are filtered out.

The to-be-treated object 10 with the oxide layer 114 formed thereon is pulled out of the first tank 72a, and the mask 64 is removed. Then, in the fluorine removing part 78, a fluorine removing process is performed on the to-be-treated object 10. For example, the fluorine removing process is a heat treatment at temperatures between 100° C. to 150° C. The treatment removes fluorine in the oxide layer 114 up to the level of 1.0% by mass or less. The to-be-treated object 10 is then put in the catalyst supporting part 74, where the catalyst 30a is made to adhere to the surface of the oxide layer 114.

The to-be-treated object 10 with the catalyst 30a supported on the oxide layer 114 is put into the plating tank 76a in the second film forming part 76. The plating tank 76a stores the electroless plating liquid 118. In the electroless plating, an oxidizer in the electroless plating liquid forms the metal film 20 with the catalyst 30a as starting points, where the metal film 20 is formed with the metal film 20 itself serving as a catalyst. In this way, the electronic products 1, having the metal film 20 formed on the to-be-treated surface 12 of the to-be-treated object 10, are obtained.

EXAMPLES

<Plated Film on Untreated LPD Film>

In the case where the fluorine removal step was not performed, oxide layers formed by the LPD method were plated, and the state of metal films was examined. As substrates, alkali-free glass, alkali glass, synthetic quartz, and alumina were used. As pre-washing, the substrates were immersed in 1M sodium hydroxide under ultrasonic irradiation for 10 minutes, further immersed in 0.1M hydrofluoric acid (HF) for 10 minutes under ultrasonic irradiation, and then washed with pure water. The film types of oxide layers were tin oxide ($SnO_2$) and titanium oxide ($TiO_2$).

When the film type of oxide layer was tin oxide ($SnO_2$), stannous fluoride ($SnF_2$: CAS No. 7783-47-3) was used as the reaction solution containing fluorine and the oxide precursor ion, and 0.1M boric acid ($H_3BO_3$: CAS No. 10043-35-3) and 0.3M hydrogen peroxide ($H_2O_2$) were used as the additive.

When the film type of oxide layer was titanium oxide ($TiO_2$), 0.3M ammonium hexafluorotitanate (($NH_4)_2TiF_6$: CAS No. 16962-40-2) was used as a reaction solution containing fluorine and the oxide precursor ion, and 0.1M boric acid ($H_3BO_3$) was used as the additive. In each case, the film thickness was adjusted by changing the reaction time. A substrate having the oxide layer formed with a predetermined thickness was washed with pure water, and then immersed in 0.1M stannous chloride (SnCl$_2$) for 2 minutes, followed by washing with pure water and drying with nitrogen blow. Then, it was immersed in 100 ppm palladium chloride (PdCl$_2$: CAS No. 7647-10-1) for 1 minute to support the catalyst thereon. Subsequently, the substrate was washed with pure water and dried with a nitrogen blow.

After the catalyst was supported, electroless NiP plating or electroless Cu plating was performed. The film thickness of the metal film was 0.8 to 1.0 μm in each case. After forming the metal film, it was washed with pure water again, dried with a nitrogen blow, and subjected to an annealing treatment for 1 hour at 200° C. as necessary.

After forming the metal film or performing the annealing treatment, the surface of the metal film was visually observed, the film thickness was measured by SEM, and the fluorine content was measured by a fluorescent X-ray apparatus. The results are shown in Table 1.

The presence or absence of "bulges" and "unevenness" was checked in visual inspection. The "unevenness" is caused by an uneven surfaces of the metal films due to variations in thickness of the metal films, and appears as variations in gloss of the metal films. More specifically, due to change in light reflectance, the metal films look dull. This is attributed to the uneven thickness of the catalyst layers. When fluorine remains on the surfaces to be treated 12, the density of the catalyst decreases, and the thickness of the catalyst layer in that area becomes thinner. This is considered to be the cause of the uneven thickness of the catalyst layers.

As for inspection determination, when the gloss of the entire surface of laminated metal are uniform under fluorescent light, "unevenness absent" is determined. When any portion of the surface is dull, "unevenness present" is determined.

The "bulges" occur due to insufficient bonding between a metal film and a base surface, which locally causes separation of the metal film and generates a hemispherical protrusion. This is because when fluorine remains on some portions of the oxide layer and completely repels the catalyst, there is no catalyst in that portions, so that the oxide layer as a base does not adhere to a metal film, and generates the metal film in a separated state. When heat treatment is applied, the remaining fluorine is volatilized, and the bulges become more pronounced.

As for inspection determination, when any one visually recognizable hemispherical protrusion is present over the entire surface of laminated metal under a fluorescent lamp, "bulges present" is determined. Otherwise, "bulges absent" is determined.

TABLE 1

| No. [—] | Substrate [—] | Oxide Layer Film Type [—] | Oxide Layer Film Thickness [nm] | Oxide Layer Fluorine Content [wt %] | Plated Metal Film Film Type [—] | Plated Metal Film Film Thickness [um] | Post-Plating Appearance Bulges Immediately After Plating [—] | Post-Plating Appearance Bulges After Annealing [—] | Post-Plating Appearance Unevenness Immediately After Plating [—] |
|---|---|---|---|---|---|---|---|---|---|
| Preliminary Sample 1 | Alkali-Free Glass | Ti Oxide | 14 | 6.0 | Electroless NiP | 0.8~1.0 | Present | Not Applied | Present |
| Preliminary Sample 2 | Alkali-Free Glass | Ti Oxide | 35 | 6.4 | Electroless NiP | 0.8~1.0 | Present | Not Applied | Present |
| Preliminary Sample 3 | Alkali-Free Glass | Ti Oxide | 57 | 6.6 | Electroless NiP | 0.8~1.0 | Present | Not Applied | Present |
| Preliminary Sample 4 | Alkali-Free Glass | Si Oxide | 25 | 1.9 | Electroless NiP | 0.8~1.0 | Present | Not Applied | Present |
| Preliminary Sample 5 | Alkali-Free Glass | Sn Oxide | 33 | 2.6 | Electroless NiP | 0.8~1.0 | Present | Not Applied | Present |
| Preliminary Sample 6 | Alkali-Free Glass | Sn Oxide | 61 | 2.2 | Electroless NiP | 0.8~1.0 | Present | Not Applied | Present |
| Preliminary Sample 7 | Alkali-Free Glass | Sn Oxide | 112 | 2.6 | Electroless NiP | 0.8~1.0 | Present | Not Applied | Present |
| Preliminary Sample 8 | Alkali Glass | Sn Oxide | 100 | 2.3 | Electroless NiP | 0.8~1.0 | Present | Not Applied | Present |
| Preliminary Sample 9 | Synthetic Quartz | Sn Oxide | 110 | 3.0 | Electroless NiP | 0.8~1.0 | Absent | Present | Present |
| Preliminary Sample 10 | Alumina | Sn Oxide | 102 | 3.2 | Electroless NiP | 0.8~1.0 | Absent | Present | Present |
| Preliminary Sample 11 | Alkali-Free Glass | Sn Oxide | 112 | 2.6 | Electroless CU | 0.8~1.0 | Present | Not Applied | Present |

Referring to Table 1, the preliminary samples 1 to 3 correspond to the case where the film type of oxide layer was Ti. The preliminary samples 4 to 11 correspond to the case where the film type of oxide layer was Sn. In the case of the preliminary samples 8 to 10, substrates made of materials other than alkali-free glass were used. In the case of the preliminary sample 11, electroless Cu plating was performed.

The surfaces of all the metal films had a fault which could be determined as unevenness. In the preliminary samples 1 to 8 and 11, bulges occurred immediately after plating. These samples were not annealed.

Only in the case where the substrates were made of synthetic quartz and alumina (preliminary samples 9 and 10), bulges immediately after plating did not occur. However, after the annealing treatment, the bulges occurred. It can be seen that the fluorine content was not proportional to the film thickness of the oxide layer. However, the fluorine content in all the preliminary samples exceeded 1% by mass. It was therefore assumed that the bulges and unevenness occurring on the metal film after plating were caused by fluorine in the oxide layer.

<Location of Fluorine>

Next, the cross section of the oxide layer in the preliminary sample 5 was observed using transmission electron microscope-energy dispersive X-ray spectroscopy (TEM-EDX), and the amount of fluorine at spots in the film thickness direction was examined. FIG. 5 shows a photograph of the cross section.

Referring to FIG. 5, a white band portion is the oxide layer (33 nm thick). Above and below the white band, there are a metal film and a substrate. Uneven portions were observed between the oxide layer and the metal film. These portions are considered to be the cause of unevenness of the metal film. Four points were determined to be approximately distanced equally from each other in the depth direction from the surface of the oxide layer, and fluorine was measured at the four points. The results of measurement are shown in Table 2.

TABLE 2

| Analyzing Spot [—] | Fluorine Content [atom %] |
|---|---|
| 1 | 1.42 |
| 2 | 0.62 |
| 3 | 0.44 |
| 4 | 0.45 |

Referring to Table 2, the fluorine content was 1.42 atom % at spot 1 closer to the surface, 0.62 atom % at spot 2 deep in the thickness direction, and 0.44 atom % and 0.45 atom % at deeper spots 3 and 4. It was thus found that the fluorine was mostly localized near the surface of the oxide layer.

<Removing Fluorine by Leaving>

The preliminary sample 5 was left in the air to examine how the fluorine content changed. The results are shown in Table 3.

TABLE 3

| | LPD Film | | | |
|---|---|---|---|---|
| Substrate [—] | Film Type [—] | Film Thickness [nm] | Number of Days to Keep [day] | Fluorine Content [wt %] |
| Alkali-Free Glass | Sn Oxide | 33 | 0 | 2.6 |
| Alkali-Free Glass | Sn Oxide | 33 | 2 | 2.7 |

TABLE 3-continued

| | LPD Film | | | |
|---|---|---|---|---|
| Substrate [—] | Film Type [—] | Film Thickness [nm] | Number of Days to Keep [day] | Fluorine Content [wt %] |
| Alkali-Free Glass | Sn Oxide | 33 | 6 | 2.5 |
| Alkali-Free Glass | Sn Oxide | 33 | 9 | 2.4 |
| Alkali-Free Glass | Sn Oxide | 33 | 15 | 2.6 |

The number of days of leaving the preliminary sample 5 was varied to 0, 2, 6, 9, and 15. However, the fluorine content in the oxide layer was about 2.5% by mass, and showed no substantial change.

<Effects of Fluorine Removing Process>

From the foregoing, it was presumed that forming a metal film on an oxide film formed by the LPD method would cause fluorine elements to remain on the surface and inside of the film, causing damage such as unevenness and bulges to the metal film. To cope with this, a process of removing fluorine from the oxide layer was added before the metal film was formed by plating. Samples were subjected to the fluorine removing process after forming an oxide layer on a substrate, and then allowed to support a catalyst thereon, followed by electroless plating and electrolytic plating to form a metal film.

The fluorine content of the samples, having the oxide layer formed and fluorine removed, was quantitatively measured by X-ray fluorescence, and film damage caused by the removal of fluorine was observed by an optical microscope. As for damage, the oxide layer having a crack or the oxide layer dissolved and disappeared is defined as "damage present". In addition, a supported catalyst amount in the samples after the catalyst was supported was quantitatively determined by an X-ray fluorescence analyzer. After the metal film was formed, the film thickness of the samples was observed with an electron microscope, and the presence or absence of unevenness and bulges was determined through visual inspection. The oxide layer and the catalyst layer were formed by similar procedures to those in the preliminary samples.

<Fluorine Removing Process by Annealing>

Annealing was performed as the fluorine removing process. The results are shown in Table 4.

TABLE 4

| | | | LPD Step | | | | Catalyst Supporting Step |
|---|---|---|---|---|---|---|---|
| | | LPD Film | | Annealed LPD Film (120 min) | | | Catalyst |
| No. | Substrate [—] | Flim Type [—] | Film Thickness [nm] | Temperature [° C.] | Flourine Content [wt %] | Damage [—] | Supporting Amount [ug/cm2] |
| Sample 1 | Alkali-Free Glass | Ti Oxide | 35 | 50 | 5.78 | Absent | 0.001 |
| Sample 2 | Alkali-Free Glass | Ti Oxide | 35 | 100 | 3.62 | Absent | 0.001 |
| Sample 3 | Alkali-Free Glass | Ti Oxide | 35 | 150 | 0.68 | Absent | 0.006 |
| Sample 4 | Alkali-Free Glass | | | | | | |
| Sample 5 | Alkali-Free Glass | Ti Oxide | 35 | 200 | 0.42 | Absent | 0.007 |

TABLE 4-continued

| No. | Substrate | Oxide | | | | | |
|---|---|---|---|---|---|---|---|
| Sample 6 | Alkali-Free Glass | | | | | | |
| Sample 7 | Alkali-Free Glass | Sn Oxide | 35 | 50 | 2.33 | Absent | 0.002 |
| Sample 8 | Alkali-Free Glass | Sn Oxide | 36 | 100 | 2.02 | Absent | 0.002 |
| Sample 9 | Alkali-Free Glass | Sn Oxide | 35.5 | 150 | 0.49 | Absent | 0.005 |
| Sample 10 | Alkali-Free Glass | | | | | | |
| Sample 11 | Alkali-Free Glass | Sn Oxide | 35.5 | 200 | 0.32 | Absent | 0.006 |
| Sample 12 | Alkali-Free Glass | | | | | | |
| Sample 13 | Alkali-Free Glass | Sn Oxide | 61 | 200 | 0.48 | Absent | 0.007 |
| Sample 14 | Alkali-Free Glass | | | | | | |
| Sample 15 | Alkali-Free Glass | Sn Oxide | 112 | 200 | 0.31 | Absent | 0.006 |
| Sample 16 | Alkali-Free Glass | | | | | | |
| Sample 17 | Alkali-Free Glass | Sn Oxide | 152 | 200 | 0.23 | Absent | 0.006 |
| Sample 18 | Alkali-Free Glass | | | | | | |
| Sample 19 | Alkali-Free Glass | Sn Oxide | 199 | 200 | 0.5 | Absent | 0.007 |
| Sample 20 | Alkali-Free Glass | | | | | | |

| | Plating Step | | | | Post-Plating Appearance | | |
|---|---|---|---|---|---|---|---|
| | Electroless Plating | | Electrolytic Plating | | Bulges | | Unevenness |
| No. | Film Type [—] | Film Thickness [μm] | Film Type [—] | Film Thickness [μm] | Immediately After Plating [—] | After Annealing [—] | Immediately After Plating [—] |
| Sample 1 | NiP | 0.8~1.0 | Not Applied | Not Applied | Present | Not Applied | Present |
| Sample 2 | NiP | 0.8~1.0 | Not Applied | Not Applied | Present | Not Applied | Present |
| Sample 3 | NiP | 0.8~1.0 | Not Applied | Not Applied | Absent | Absent | Absent |
| Sample 4 | NiP | 0.8~1.0 | Cu | 9~10 | Absent | Absent | Absent |
| Sample 5 | Cu | 0.5~0.6 | Not Applied | Not Applied | Absent | Absent | Absent |
| Sample 6 | Cu | 0.5~0.6 | Cu | 9~10 | Absent | Absent | Absent |
| Sample 7 | NiP | 0.8~1.0 | Not Applied | Not Applied | Present | Not Applied | Present |
| Sample 8 | NiP | 0.8~1.0 | Not Applied | Not Applied | Present | Not Applied | Present |
| Sample 9 | NiP | 0.8~1.0 | Not Applied | Not Applied | Absent | Absent | Absent |
| Sample 10 | NiP | 0.8~1.0 | Cu | 9~10 | Absent | Absent | Absent |
| Sample 11 | Cu | 0.5~0.6 | Not Applied | Not Applied | Absent | Absent | Absent |
| Sample 12 | Cu | 0.5~0.6 | Cu | 9~10 | Absent | Absent | Absent |
| Sample 13 | NiP | 0.8~1.0 | Not Applied | Not Applied | Absent | Absent | Absent |
| Sample 14 | NiP | 0.8~1.0 | Cu | 9~10 | Absent | Absent | Absent |
| Sample 15 | Cu | 0.5~0.6 | Not Applied | Not Applied | Absent | Absent | Absent |
| Sample 16 | Cu | 0.5~0.6 | Cu | 9~10 | Absent | Absent | Absent |
| Sample 17 | Cu | 0.5~0.6 | Not Applied | Not Applied | Absent | Absent | Absent |
| Sample 18 | Cu | 0.5~0.6 | Cu | 9~10 | Absent | Absent | Absent |
| Sample 19 | Cu | 0.5~0.6 | Not Applied | Not Applied | Absent | Absent | Absent |
| Sample 20 | Cu | 0.5~0.6 | Cu | 9~10 | Absent | Absent | Absent |

Referring to Table 4, the fluorine content in an LPD film after annealing for 120 minutes at a prescribed temperature was examined. The fluorine content was reduced to less than 1% by mass at temperatures above 150° C. (samples 3 to 6, and 9 to 20). The samples (1, 2, 7, and 8) with the fluorine content exceeding 1% by mass were lower in catalyst supporting amount than other samples. Since bulges and unevenness of the film were confirmed in these samples at the time when electroless plating was applied, electrolytic plating was not applied to these samples.

When the fluorine content was less than 1% by mass, bulges and unevenness did not occur in the final metal film. Annealing the metal film did not generate bulges, either.

From the above results, it was found that when the fluorine content of the oxide layer was 1% by mass or less, the metal film formed on the oxide layer were not damaged, so that a uniform metal film can be formed. This was not dependent on the film type of oxide layer or the type of electroless plated film.

<Fluorine Removing Process by Chemical Treatment>

Chemical treatment was performed as the fluorine removing process. The results are shown in Table 5.

TABLE 5

| No. | Substrate [—] | LPD Step LPD Film | | Fluorine Removal Step LPD Film After Chemical Treatment (30 min) | | | |
|---|---|---|---|---|---|---|---|
| | | Film Type [—] | Film Thickness [nm] | Chemical Type [—] | pH [—] | Fluorine Content [wt %] | Damage [—] |
| Sample 21 | Alkali-Free Glass | Ti Oxide | 35 | H2SO4 | <0 | 4.159 | Absent |
| Sample 22 | Alkali-Free Glass | Ti Oxide | 35 | HCl | <0 | 3.54 | Absent |
| Sample 23 | Alkali-Free Glass | Ti Oxide | 35 | Ultrapure Water | ≈7 | 6.24 | Absent |
| Sample 24 | Alkali-Free Glass | Ti Oxide | 35 | NaOH | 10.5 | 0.78 | Absent |
| Sample 25 | Alkali-Free Glass | | | | | | |
| Sample 26 | Alkali-Free Glass | Ti Oxide | 35 | NaOH | 12.7 | 0.53 | Absent |
| Sample 27 | Alkali-Free Glass | | | | | | |
| Sample 28 | Alkali-Free Glass | Ti Oxide | 35 | KOH | 13 | 0.423 | Absent |
| Sample 29 | Alkali-Free Glass | | | | | | |
| Sample 30 | Alkali-Free Glass | Sn Oxide | 36 | H2SO4 | <0 | 1.39 | Absent |
| Sample 31 | Alkal-Free Glass | Sn Oxide | 36 | HCl | 40 | 1.23 | Absent |
| Sample 32 | Alkali-Free Glass | Sn Oxide | 36 | Ultrapure Water | ≈7 | 2.43 | Absent |
| Sample 33 | Alkali-Free Glass | Sn Oxide | 36 | NaOH | 10.5 | 0 | Present (Dissolved and Disappeared) |
| Sample 34 | Alkali-Free Glass | Sn Oxide | 36 | NaOH | 12.7 | 0 | Present (Dissolved and Disappeared) |
| Sample 35 | Alkali-Free Glass | Sn Oxide | 36 | KON | 13 | 0 | Present (Dissolved and Disappeared) |
| Sample 36 | Alkali-Free Glass | Si Oxide | 25 | NaOH | 10.5 | 0.45 | Absent |
| Sample 37 | Alkali-Free Glass | | | | | | |

| No. | Catalyst Supporting Step Catalyst Supporting Amount [ug/cm2] | Plating Step | | | | Post-Plating Appearance Bulges | |
|---|---|---|---|---|---|---|---|
| | | Electroless Plating | | Electrolytic Plating | | | |
| | | Film Type [—] | Film Thickness [um] | Film Type [—] | Film Thickness [um] | Immediately After Plating [—] | After Annealing [—] |
| Sample 21 | 0.001 | NiP | 0.8~1.0 | — | — | Present | Not Applied |
| Sample 22 | 0.001 | NiP | 0.8~1.0 | — | — | Present | Not Applied |
| Sample 23 | 0 | NiP | 0.8~1.0 | — | — | Present | Not Applied |
| Sample 24 | 0.007 | NiP | 0.8~1.0 | — | — | Absent | Absent |
| Sample 25 | | NiP | 0.8~1.0 | Cu | 9~10 | Absent | Absent |
| Sample 26 | 0.008 | Cu | 0.5~0.6 | — | — | Absent | Absent |

TABLE 5-continued

| Sample | | | | | | | |
|---|---|---|---|---|---|---|---|
| Sample 27 | | Cu | 0.5~0.6 | Cu | 9~10 | Absent | Absent |
| Sample 28 | 0.007 | Cu | 0.5~0.6 | — | — | Absent | Absent |
| Sample 29 | | Cu | 0.5~0.6 | Cu | 9~10 | Absent | Absent |
| Sample 30 | 0.001 | NiP | 0.8~1.0 | — | — | Present | Not Applied |
| Sample 31 | 0.001 | NiP | 0.8~1.0 | — | — | Present | Not Applied |
| Sample 32 | 0 | NiP | 0.8~1.0 | — | — | Present | Not Applied |
| Sample 33 | 0 | NiP | 0 (Not Activated) | — | — | — | — |
| Sample 34 | 0 | Cu | 0 (Not Activated) | — | — | — | — |
| Sample 35 | 0 | Cu | 0 (Not Activated) | — | — | — | — |
| Sample 36 | 0.007 | Cu | 0.5~0.6 | — | — | Absent | Absent |
| Sample 37 | | Cu | 0.5~0.6 | Cu | 9~10 | Absent | Absent |

Referring to Table 5, samples 21 to 29 correspond to the case where the film type of oxide layer was a Ti oxide, samples 30 to 36 correspond to the case where the film type was an Sn oxide, and a sample 37 corresponds to the case where the film type was an Si oxide. As a chemical treatment, the samples were each immersed in a solution containing sulfuric acid, hydrochloric acid, ultrapure water, sodium hydroxide, or potassium hydroxide for 30 minutes. The pH of each solution is shown in Table 5. As a result of examining the fluorine content of the oxide layers after treatment, the fluorine was reduced by the treatment with an alkali solution. However, when the film type of oxide layer was an Sn oxide, the oxide layer itself dissolved and disappeared with the alkali solution. This is considered to be because Sn is an amphoteric oxide.

The samples (24 to 29, 36, and 37) having a fluorine content of 1% by mass or less passed the subsequent plating step smoothly, and bulges and unevenness of the metal film did not occur in both the case where only electroless plating was applied and the case where electrolytic plating was applied after the electroless plating. Annealing the metal film did not generate bulges, either.

On the other hand, the samples (21 to 23, and 30 to 35), in which a fluorine content in the oxide layer was 1% by mass or more, were confirmed to have bulges in the metal film formed by electroless plating.

As described above, the alkali treatment of pH 10.5 or more was suitable as the chemical treatment. However, it was found that when the film type of oxide layer is an amphoteric oxide, the film itself dissolves. Therefore, when the film type of oxide layer is an amphoteric oxide, the fluorine removing process by the annealing treatment is suitable.

<Fluorine Removing Process for Thick Film>

The samples described so far has relatively thin oxide layers of 200 nm or less. However, the oxide layer of film thickness variations may be required for various reasons. Accordingly, the effects of the fluorine removing process were confirmed for the oxide layers with a thickness of 200 nm or more. The results are shown in Table 6.

TABLE 6

| | | LPD Step | | | Fluorine Removal Step | | | | | | |
|---|---|---|---|---|---|---|---|---|---|---|---|
| | | | Film | | | Annealing (120 min) | | | Alkali Treatment (30 min) | | |
| No. [—] | Substrate [—] | Film Type [—] | Thickness [nm] | Fluorine Content [wt %] | Temperature [°C.] | Fluorine Content [wt %] | Damage [—] | Chemical Type [—] | pH [—] | Fluorine Content [wt %] | Damage [—] |
| Sample 38 | Alkali-Free Glass | SnO2 | 251 | 2.28 | 200 | 0.32 | Crack Occurred | NaOH | 10.5 | 0 | Separated |
| Sample 39 | Alkali-Free Glass | SnO2 | 251 | 2.28 | 150 | 0.49 | Crack Occurred | NaOH | 10.5 | 0.38 | Separated |
| Sample 40 | Alkali-Free Glass | SnO2 | 251 | 2.28 | 100 | 2.02 | Absent | NaOH | 10.5 | 0.69 | Absent |
| Sample 41 | Alkali-Free Glass | SnO2 | 251 | 2.28 | | | | | | | |
| Sample 42 | Alkali-Free Glass | SnO2 | 251 | 2.28 | | | | | | | |
| Sample 43 | Alkali-Free Glass | SnO2 | 251 | 2.28 | | | | | | | |
| Sample 44 | Alkali-Free Glass | SnO2 | 251 | 2.28 | 50 | 2.28 | Absent | NaOH | 10.5 | 0 | Film Dissolved |

TABLE 6-continued

| | Catalyst | | Plating Step | | | Post-Plating Appearance | | |
| | Supporting Step | | | | Electrolytic Plating | Bulges | | Unevenness |
| | | Catalyst | Electroless Plating | | | Film | Immediately | After | Immediately |
| No. [—] | Supporting Amount [ug/cm2] | Film Type [—] | Film Thickness [um] | Film Type [—] | Thickness [um] | After Plating [—] | Annealing [—] | After Plating [—] |
|---|---|---|---|---|---|---|---|---|
| Sample 38 | 0 | NiP | 0 (Not Activated) | — | — | — | — | — |
| Sample 39 | 0 | NiP | 0 (Not Activated) | — | — | — | — | — |
| Sample 40 | 0.009 | NiP | 0.8~1.0 | Not Applied | Not Applied | Absent | Absent | Absent |
| Sample 41 | | NiP | 0.8~1.0 | Cu | 9~10 | Absent | Absent | Absent |
| Sample 42 | | Cu | 0.5~0.6 | — | — | Absent | Absent | Absent |
| Sample 43 | | Cu | 0.5~0.6 | Cu | 9~10 | Absent | Absent | Absent |
| Sample 44 | 0 | NiP | 0 (Not Activated) | — | — | — | — | — |

Referring to Table 6, samples (38 and 39) with the film type of oxide layer being an Sn oxide and the film thickness being 200 nm or more had a crack generated by the annealing treatment at 200° C. and 150° C. (120 minutes). At the annealing temperature of 100° C. or 50° C., no cracks are generated (samples to 44). However, at the annealing temperature of 100° C., fluorine was not removed, as shown with the samples (7 and 8) in Table 4.

Accordingly, a chemical treatment with alkali with a pH of 10.5 was further performed. As shown with the sample 33 in Table 5, this was a condition under which a film with a thin film thickness dissolved and disappeared. However, in the samples (40 to 43) annealed at 100° C. for 120 minutes, the fluorine was removed without causing the film to dissolve. However, the sample 44 with an annealing temperature of 50° C. dissolved and disappeared. Therefore, it is considered that a suitable annealing treatment could bake up the oxide layer and impart durability to the alkali treatment. Note that the alkali treatment at the time did not damage the oxide film even at pH 12. In addition, when the samples 38 and 39 which had a crack were subjected to the alkali treatment in the same manner, the films were separated from the substrates.

A uniform metal film was formed on the oxide layer where fluorine was removed to 1% by mass or less by the annealing treatment at 100° C. and the chemical treatment at a pH of 10.5. In both the case where only electroless plating was applied and the case where electrolytic plating was applied after the electroless plating, there was no film damage such as bulges and unevenness. When the annealing treatment is applied to the film, bulges of the film did not occur. In the samples 38 to 44, the film type of oxide layer was Sn, which is an amphoteric oxide. However, it was confirmed that in the case of Ti being and acidic oxide, fluorine could be removed by the similar treatment.

As described in the foregoing, when the film thickness is 200 nm or more, fluorine in the oxide layer 114 can be removed, regardless of the metal type, by using both the annealing treatment at 100° C. to 150° C. and the alkali solution treatment with a solution having a pH of 10.5 or higher.

Furthermore, when the film thickness is less than 200 nm and the metal type of oxide layer 114 is one which forms an amphoteric oxide such as Sn (tin), Al (aluminum), Zn (zinc), Be (beryllium), Ga (gallium), Ge (germanium), Pb (lead), Sb (antimony), Bi (bismuth), and Cd (cadmium), fluorine can be removed from the oxide layer 114 by using both the annealing treatment at 100° C. to 150° C. and the alkali solution treatment with a solution with a pH of 10.5 or higher, or by the annealing treatment at 150° C. or higher.

In addition, when the film thickness is less than 200 nm and the metal type of oxide layer 114 is not an amphoteric oxide, fluorine in the oxide layer 114 can be removed by the annealing treatment at 150° C. or higher or the alkali solution treatment with a pH of 10.5 or higher.

INDUSTRIAL APPLICABILITY

The laminated film structure and the method for manufacturing the laminated film structure according to the present invention can be used not only for electronic-related products such as circuit boards, semiconductor circuits, and electronic components, but also for protective films and finishing films for decoration.

REFERENCE SIGNS LIST

1 electronic product
10 to-be-treated object
10a insulating substrate
10b conductive layer
10h through hole
10hi inner wall
12 to-be-treated surface
12a cross-sectional portion
12b cross-sectional portion
16 ultraviolet rays
118 electroless plating liquid
20 metal film
20i metal film in through hole
30 catalyst solution
30a catalyst
64 mask
70 apparatus for forming metal film
72 first film forming part
72a first tank
72b filter
72d circulation pipeline
72c pump
72e reaction initiator tank
72f pipeline
72j heater
72g valve
74 catalyst supporting part
74a catalyst solution tank
76 second film forming part
76a second tank 78 fluorine removing part
80 reaction solution containing fluorine and oxide precursor ion
114 oxide layer
114i titanium oxide-containing layer formed on inner wall of through hole
118 electroless plating liquid

What is claimed is:

1. A method for manufacturing a laminated film structure comprising:
    forming an oxide layer on a to-be-treated surface of a to-be-treated object by bringing the to-be-treated surface into contact with a reaction solution containing fluorine and an oxide precursor, the to-be-treated object being made of an insulator or an insulator having a conductive layer formed on the surface thereof in advance;
    removing fluorine in the oxide layer;
    forming a catalyst layer by bringing the oxide layer into contact with a catalyst liquid; and
    forming a metal film on the catalyst layer by an electroless plating method.

2. The method for manufacturing the laminated film structure according to claim 1, wherein the oxide precursor includes at least one type or more elements selected from titanium, silicon, tin, zirconium, zinc, nickel, indium, vanadium, chromium, manganese, iron, cobalt, and copper.

3. The method for manufacturing the laminated film structure according to claim 1, wherein the reaction solution includes at least one type of a boric acid salt, an aluminum salt, and hydrogen peroxide.

4. The method for manufacturing the laminated film structure according to claim 1, wherein the catalyst liquid contains at least one type of element selected from gold, palladium, and silver.

5. The method for manufacturing the laminated film structure according to claim 1, further comprising forming a second metal layer on the metal layer by an electrolytic plating method.

6. The method for manufacturing the laminated film structure according to claim 1, wherein the metal layer formed by the electroless plating method contains at least one type of element selected from nickel and copper.

7. The method for manufacturing the laminated film structure according to claim 1, wherein:
    a thickness of the oxide layer is 200 nm or more; and
    the fluorine removal includes
        annealing the oxide layer at 100° C. or higher and 150° C. or lower, and
        bringing the oxide layer into contact with an alkali solution with a pH of 10.5 or higher, after the annealing.

8. The method for manufacturing the laminated film structure according to claim 1, wherein:
    a thickness of the oxide layer is less than 200 nm;
    the oxide layer is formed of an amphoteric oxide; and
    the fluorine removal includes any of:
        annealing the oxide layer at 150° C. or higher; or
        annealing the oxide layer at 100° C. or higher and 150° C. or lower, and
        bringing the oxide layer into contact with an alkali solution with a pH of 10.5 or higher, after the annealing.

9. The method for manufacturing the laminated film structure according to claim 1, wherein:
    a thickness of the oxide layer is less than 200 nm;
    the oxide layer is formed of a material other than an amphoteric oxide; and
    the fluorine removal includes any of:
        annealing the oxide layer at 150° C. or higher; or
        bringing the oxide layer into contact with an alkali solution with a pH of 10.5 or higher.

* * * * *